US005200751A

United States Patent [19]

Smith

[11] Patent Number: 5,200,751

[45] Date of Patent: Apr. 6, 1993

[54] DIGITAL TO ANALOG CONVERTER USING A PROGRAMMABLE LOGIC ARRAY

[75] Inventor: Michael D. Smith, Lewisville, Tex.

[73] Assignee: Dallas Semiconductor Corp., Dallas, Tex.

[21] Appl. No.: 371,464

[22] Filed: Jun. 26, 1989

[51] Int. Cl.[5] .............................................. H03M 1/76

[52] U.S. Cl. .................................... 341/147; 341/154

[58] Field of Search ............... 341/144, 147, 148, 153, 341/154; 307/465

[56] References Cited

U.S. PATENT DOCUMENTS

| | | | |
|---|---|---|---|
| 4,366,470 | 12/1982 | Takanashi et al. | 341/148 |
| 4,462,021 | 7/1984 | Watanabe et al. | 341/144 |
| 4,543,560 | 9/1985 | Holloway | 341/144 |
| 4,641,131 | 2/1987 | Demmer | 341/144 |
| 4,758,745 | 7/1988 | Elgamal et al. | 307/465 |
| 4,763,105 | 7/1989 | Jeno | 341/120 |
| 4,816,830 | 3/1989 | Cooper | 341/153 |
| 4,918,448 | 4/1990 | Hauviller et al. | 341/145 |

FOREIGN PATENT DOCUMENTS

| | | | |
|---|---|---|---|
| 61-296824 | 12/1986 | Japan | 341/144 |
| 63-169125 | 7/1988 | Japan | 341/144 |

OTHER PUBLICATIONS

"A CMOS 10-Bit D/A Converter," 1974 ISSCC Digest 196–197.

*Primary Examiner*—Howard L. Williams
*Attorney, Agent, or Firm*—Worsham, Forsythe, Sampels & Wooldridge

[57] ABSTRACT

A digital to analog converter, wherein a time/voltage array is programmable, to determine which of the possible reference voltages will be enabled by which of the control inputs. Anther set of programmable options, in an output connection matrix, determines which of the internal voltage lines will be connected to which output lines. After the output connection matrix, output selection logic is used to determined which class of output levels are to be used. The output selection logic also preferably includes polarity-reversal gates, so that the polarity of a bipolar output can be reversed.

3 Claims, 8 Drawing Sheets

DIGITAL TO ANALOG CONVERTER USING A PROGRAMMABLE LOGIC ARRAY

CROSS-REFERENCE TO OTHER APPLICATIONS

The following application of common assignee contains related subject matter, and is believed to have an effective filing data identical with that of the present application:

Ser. No. 07/371,465, filed Jun. 26 1989, entitled "WAVESHAPING SUBSYSTEM USING CONVERTER AND DELAY LINES" (2846-119), which is hereby incorporated by reference.

BACKGROUND AND SUMMARY OF THE INVENTION

The present invention relates to circuits for translating a digital number into an analog voltage level: such circuits are known as digital to analog converters, or DACs.

The two chief variables in digital to analog converters are resolution and speed. For example, a converter which can operate at a data rate of 30 MHz will be more expensive than a converter which can only operate at 10 MHz (if their resolutions are equal); and a converter with 12 bits of resolution will be more expensive than one with only 10 bits of resolution (if their other parameters are the same).

A variety of architectures are conventionally used for digital-to-analog converters. For example, one commonly used technique is a "current-summing" architecture, wherein current contributions from switchable resistors are summed, and then converted to define an analog output voltage. (In the "R/2R" versions of this architecture, the switchable resistors are not simply switched in or out, but instead each switch selects between a resistor and another resistor of twice the value.) Another general class of architectures use switched-capacitor techniques. A good general discussion of converters may be found in P. Allen and D. Holberg, *Analog Circuit Design* (1987)(which is hereby incorporated by reference). A description of a conventional CMOS converter may be found in Cecil, "A CMOS 10-Bit D/A Converter," which appeared at page 196 of the 1974 ISSCC Digest, and which is hereby incorporated by reference.

Conventionally, digital to analog converter architectures and analog to digital converter architectures have had a very close relation. Not only are the system applications often similar or identical, but many of the same circuit techniques are actually used. This overlap may have constrained the evolution of digital-to-analog converter design: the present application provides an architecture for digital to analog converters which is not similar to analog to digital architectures. This unusual architecture has substantial advantages over normal digital to analog converters, particularly in applications where waveform shaping is required.

Several digital to analog converters (DACs) are in existence that allow programmable output levels through the use of amplifiers or similar techniques. However, the present invention provides a different (and much more versatile) type of programmability. This is particularly advantageous for waveshaping.

Among the innovative teachings set forth herein is an integrated circuit digital to analog converter, which includes multiple row lines. Each of the row lines is connected to a scaled fraction of a reference voltage, and includes multiple selection gates in series. Each of these selection gates is programmable, to define whether it will respond to the control line to which it is connected. The connections of the row lines to a matrix of busses are also programmable. The selection gates are preferably configured so that, for substantially every normal value of control inputs, multiple result lines will be driven simultaneously. Thus, the present invention provides a digital-to-analog converter which allows multiple tap points and multiple programmable output levels which are programmable using the metal mask only.

A further set of innovative teachings provides an integrated circuit digital to analog converter, wherein multiple row lines, each connected to a respective reference voltage, are configured so that, for substantially every normal value of control inputs, multiple result lines will be driven simultaneously with different respective voltages; and output selection gates, connected to select one of the result lines for output.

These innovative teachings result in tremendous design flexibility, with many options available. One important resulting advantage is quick turnaround for program changes, since the metal definition is one of the last steps in the process of manufacturing silicon.

The preferred chip embodiment uses this digital-to-analog converter to build a waveform to meet an output template. Since one of several templates may need to be met, depending on load conditions, the digital-to-analog converter needs selectability.

It should also be noted that, during the design of partly-customized analog integrated circuits for waveform synthesis, extensive modelling may often be required to define the templates precisely. In some cases, experimental test results may suggest modifications quite late in the design process. For such applications, the programmability provided by the present invention is highly advantageous.

The invention provides a multitap, programmable-level digital-to-analog converter using metal mask only to define its characteristics.

Many uses of a digital-to-analog converter are driven by an end requirement of shaping waveforms, and the instantaneous conversion of bits to voltages is merely a means to that end. Thus, the digital-to-analog converter of the present invention provides an architecture which permits the user to depart significantly from the normal ways of characterizing the performance of digital-to-analog converters, but which in many cases will be much more advantageous to users than a conventional digital-to-analog converter would be.

BRIEF DESCRIPTION OF THE DRAWING

The present invention will be described with reference to the accompanying drawings, which show important sample embodiments of the invention, wherein.

DESCRIPTION OF THE PREFERRED EMBODIMENTS

The numerous innovative teachings of the present application will be described with particular reference to the presently preferred embodiment, wherein these innovative teachings are advantageously applied to the particular problems of waveform synthesis to meet the transmit interface requirements of the T1 standard. However, it should be understood that this embodiment is only one example of the many advantageous uses of the innovative teachings herein. In general, statements made in the specification of the present application do not necessarily delimit any of the various claimed inventions. Moreover, some statements may apply to some inventive features but not to others.

Figure 1:
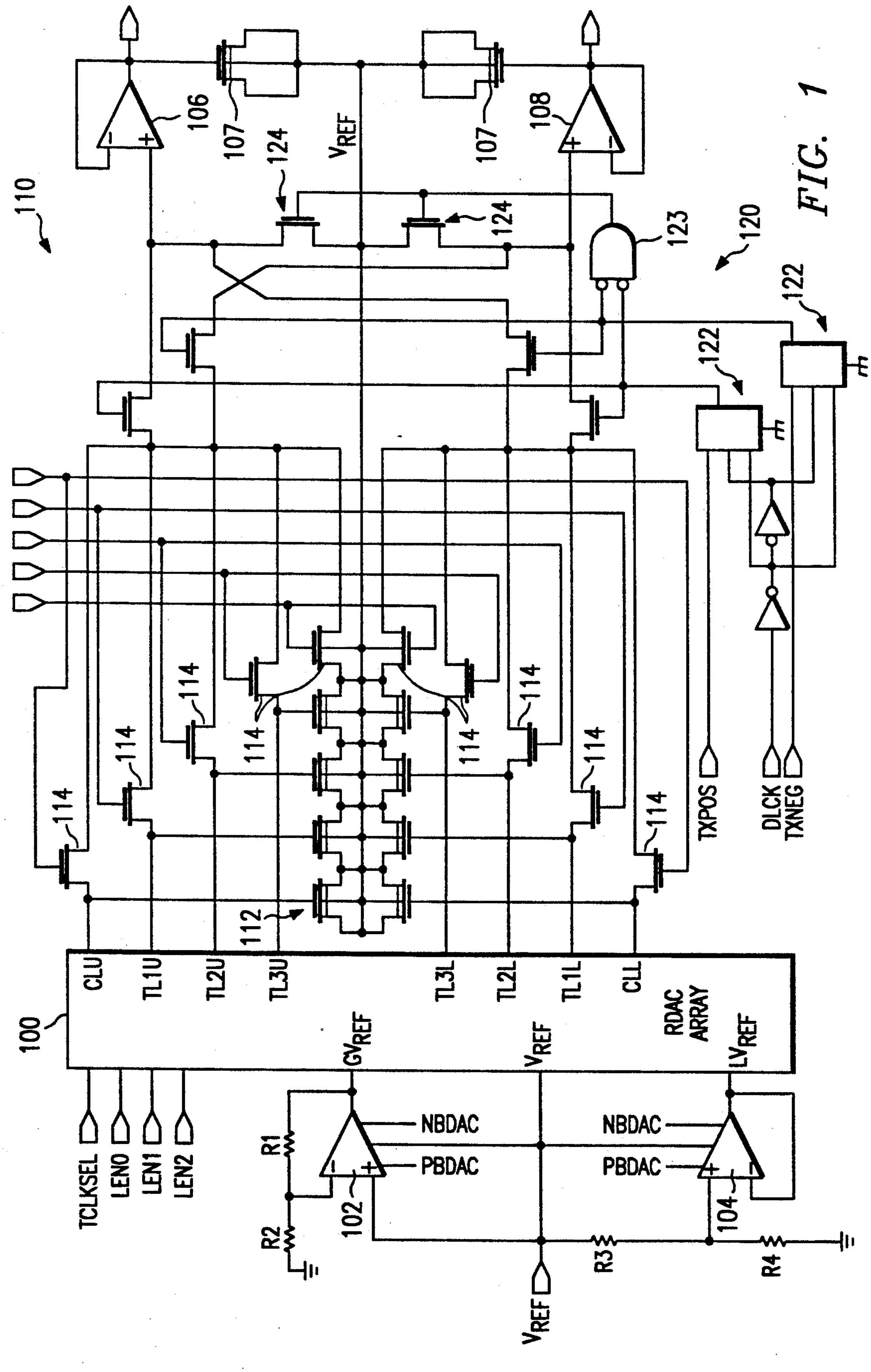
FIG. 1 shows the overall organization of the digital-to-analog converter of the presently preferred embodiment.

FIG. 1 shows the overall organization of a key portion of the digital-to-analog converter of the presently preferred embodiment. This embodiment is a double-ended digital-to-analog converter, which can provide exactly matching waveforms at either of $OUT_{POS}$ and $OUT_{NEG}$.

An input voltage $V_{REF}$ (which may be obtained, for example, from an on-chip bandgap voltage reference) is provided as a central input to the voltage/time array 100. This reference voltage $V_{REF}$ is also fed through op amps 102 and 104, to generate a greater (maximum) reference voltage $GV_{REF}$ and a lesser (minimum) reference voltage $LV_{REF}$. Resistors $R_1$ and $R_2$ set voltage $GV_{REF}$, and resistors $R_3$ and $R_4$ set voltage $LV_{REF}$. By matching $R_1$-$R_4$, variations in supply, temperature, processing, and $V_{REF}$ values can be eliminated, as can be seen by the following equations:

$$GV_{REF} = \frac{(R_1 + R_2)}{R_2} V_{REF}$$

$$LV_{REF} = \frac{R_4}{(R_3 + R_4)} V_{REF}$$

The positive and negative waveforms will be matched if:

$$Abs(GV_{REF} - V_{REF}) = Abs(V_{REF} - LV_{REF}).$$

By eliminating $V_{REF}$, this gives $$\frac{R_1 + R_2}{R_2} + \frac{R_4}{R_3 + R_4} = 2.$$

The array 100 produces outputs intermediate between $V_{REF}$ and $GV_{REF}$ on one side (and, on the other side, outputs intermediate between $V_{REF}$ and $LV_{REF}$), as selected by control inputs to the array (which are not shown).

In the presently preferred embodiment, the array 100 produces eight outputs in parallel (CLU, CLD, TL1U, TL1L, TL2U, TL2L, TL3U, and TL3D) for every control input. (Each of these output lines is tied back to $V_{REF}$ through a filtering capacitor 112.) Output multiplexing logic 110 selects which pair of these output lines will provide the voltage levels for the output pair $OUT_{POS}/OUT_{NEG}$.

Timing control signals TCEPT, TT1, TT2, TT3, and TEND control five pairs of switching transistors 114. Signals TCEPT and TEND are used to synthesize CEPT waveforms, while signals TT1, TT2, TT3, and TEND are used for T1 waveforms.

Polarity reversal logic 120 (controlled by inputs TXPOS and TXNEG, as clocked through flip-flops 122) selects which one of the selected output pair will be connected to drive $OUT_{POS}$, and which one will be connected to drive $OUT_{NEG}$. Signal TXNEG indicates an inverted mark and signal TXPOS indicates a non-inverted mark. During a space, neither TXPOS nor TXNEG will be high, and NAND gate 123 will turn on transistors 124 to tie both outputs to $V_{REF}$. This polarity reversal is required for AMI formats such as T1 and CEPT, since it guarantees that the same waveform will appear for every mark signal, whether inverted or non-inverted.

Finally, two op amp follower stages 106 and 108 drive the final outputs $OUT_{POS}$ and $OUT_{NEG}$, in accordance with the signals received from the polarity reversal logic 120. Two slew-rate-limiting capacitors 107 are provided at the final outputs; these also provide frequency compensation for op amps 106 and 108.

Figure 2:
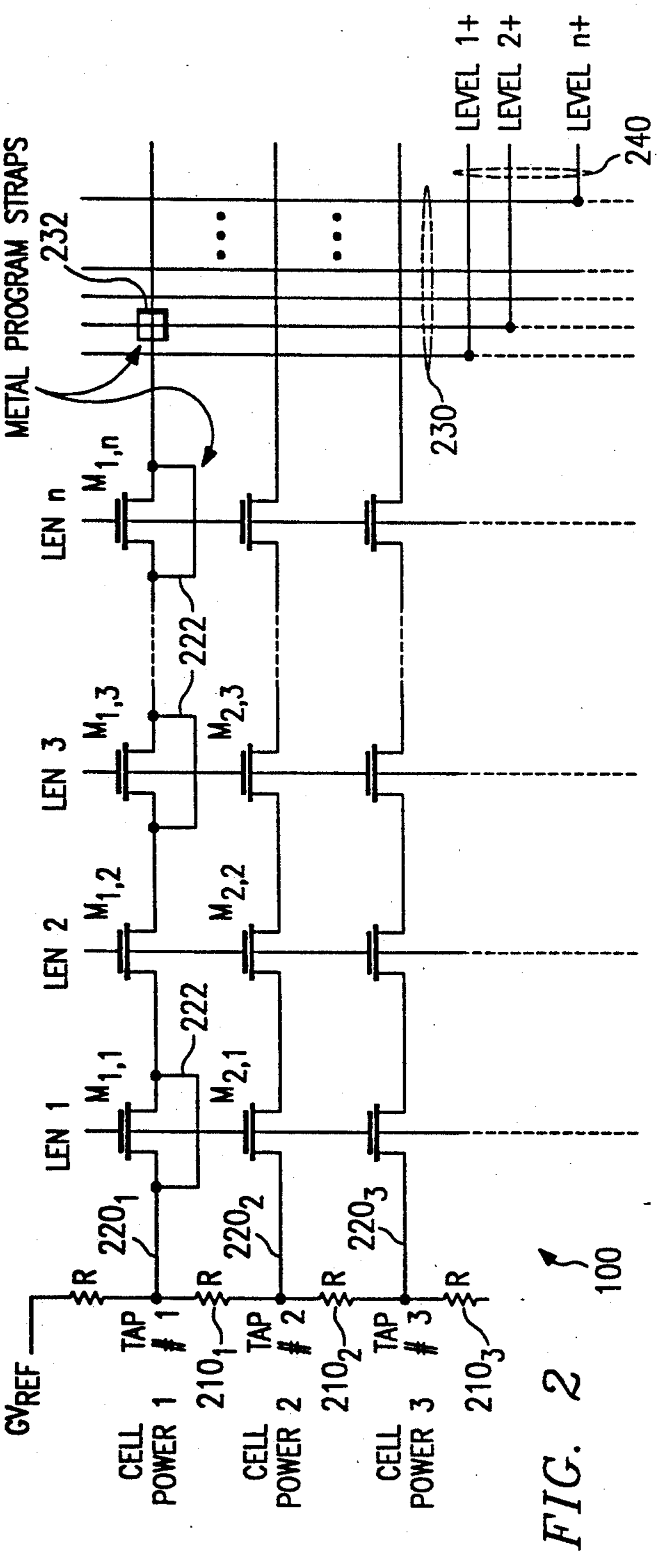
FIG. 2 shows the organization of the voltage/time array 100.
Figure 4A:
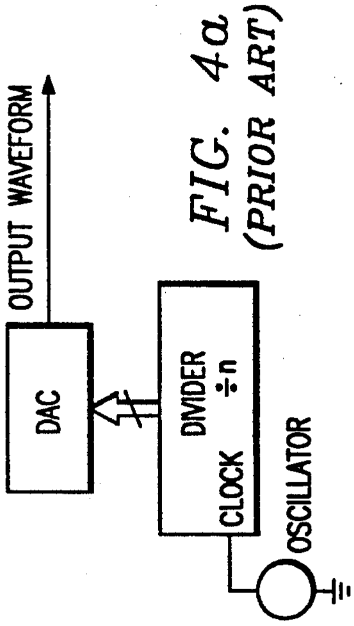
FIG. 4a (PRIOR ART)
FIGS. 4A and 4B show a conventional waveform generation system, controlled by a high-frequency oscillator.
Figure 4B:
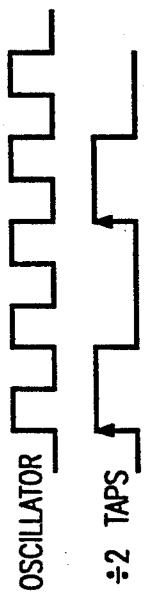
FIG. 4b (PRIOR ART)

FIG. 2 shows the organization of the voltage/time array 100. Since this is a regular array, only some of the repeating elements are shown. Moreover, it should be noted that this is a programmable array design, and an important aspect of this design is the ease with which certain elements can be changed.

A resistor divider 210 is used to quantize the voltage levels. Resistors $210_1$, $210_2$, $210_3$, etc., divide down the difference between $GV_{REF}$ and $V_{REF}$ into the desired number of levels. Each of the row lines 220 is connected to one of the taps on the resistor string 210. Thus, for example, the first row line $220_1$ sees a voltage which is equal to $$V_{REF} + (GV_{REF} - V_{REF})\left(\frac{R_{SUM} - R_{210/1}}{R_{SUM}}\right),$$

where $R_{SUM}$ is the resistance of the whole string 210, and $R_{210/1}$ is the resistance of the single resistor $210_1$. The voltages on the other row lines $220_2$, $220_3$, etc., will be similarly scaled. In the presently preferred embodiment, each of the resistors $210_k$ has the same value. However, of course, this is not by any means a necessary part of the invention.

Each of the row lines $220_k$ includes a series string of transistors $M_{k,1}$-$M_{k,n}$. The gate of transistor $M_{k,1}$ is connected to a control input LEN1, the gate of transistor $M_{k,2}$ is connected to a control input LEN2, and so forth. The number of control inputs n is arbitrary, and can be readily changed by designers.

Programmable metal straps 222 are available to short out any one of the transistors $M_{k,j}$. In the example of FIG. 2, these straps are shown in the first row only. Note that every transistor in the first row is shorted out, except for transistor $M_{1,2}$. Thus, in this example the first row will be conductive if and only if control line LEN2 is driven high.

In the presently preferred embodiment, each of the rows 220 is connected to be totally conditional on a single control input. However, as discussed below, other control strategies can be used instead. If more than one transistor in a row is left operable, the output of that row will be dependent on an AND combination of multiple control inputs.

At the other end of the row lines 220 (opposite to the resistor string 210), the row lines 220 cross a set of column busses 230. The intersecting row lines 220 and column busses 230 are not automatically connected: a connection is formed only where a strap 232 of programmable metal is formed. Again, an example of such a connection is shown only in row 1: the output of the first row $220_1$ is connected, through the second column buss 230 to the second result line TL2U.

Each of the result lines 240 is connected to one of the column busses. Thus, there need to be at least as many column busses as result lines. However, optionally, there may be more column busses than result lines, which can be advantageous as described below.

In the presently preferred embodiment, the column busses 230 do not connect the top and bottom halves of the array 100. However, this could be done in alternative embodiments, to provide greater resolution at voltages close to $V_{REF}$.

In a further alternative embodiment, some or all of the column lines 230 can be extended to provide the outputs of the array 100, without using separate result lines 240. However, this is not preferred.

In the presently preferred embodiment, each half of the array 100 includes 100 row lines, 6 series transistors on each row line, 8 column busses, and four output lines. However, of course, these numbers can readily be varied.

For example, FIG. 2 shows cell Row 1 programmed for the first tap point to connect to TL2U when LEN2 goes high; no other logic level will connect TL2U to this tap point. Should the user desire to modify TL2 to tap no. 3 when LEN2 is selected, a simple metal-mask modification will accomplish this.

Figure 3A:
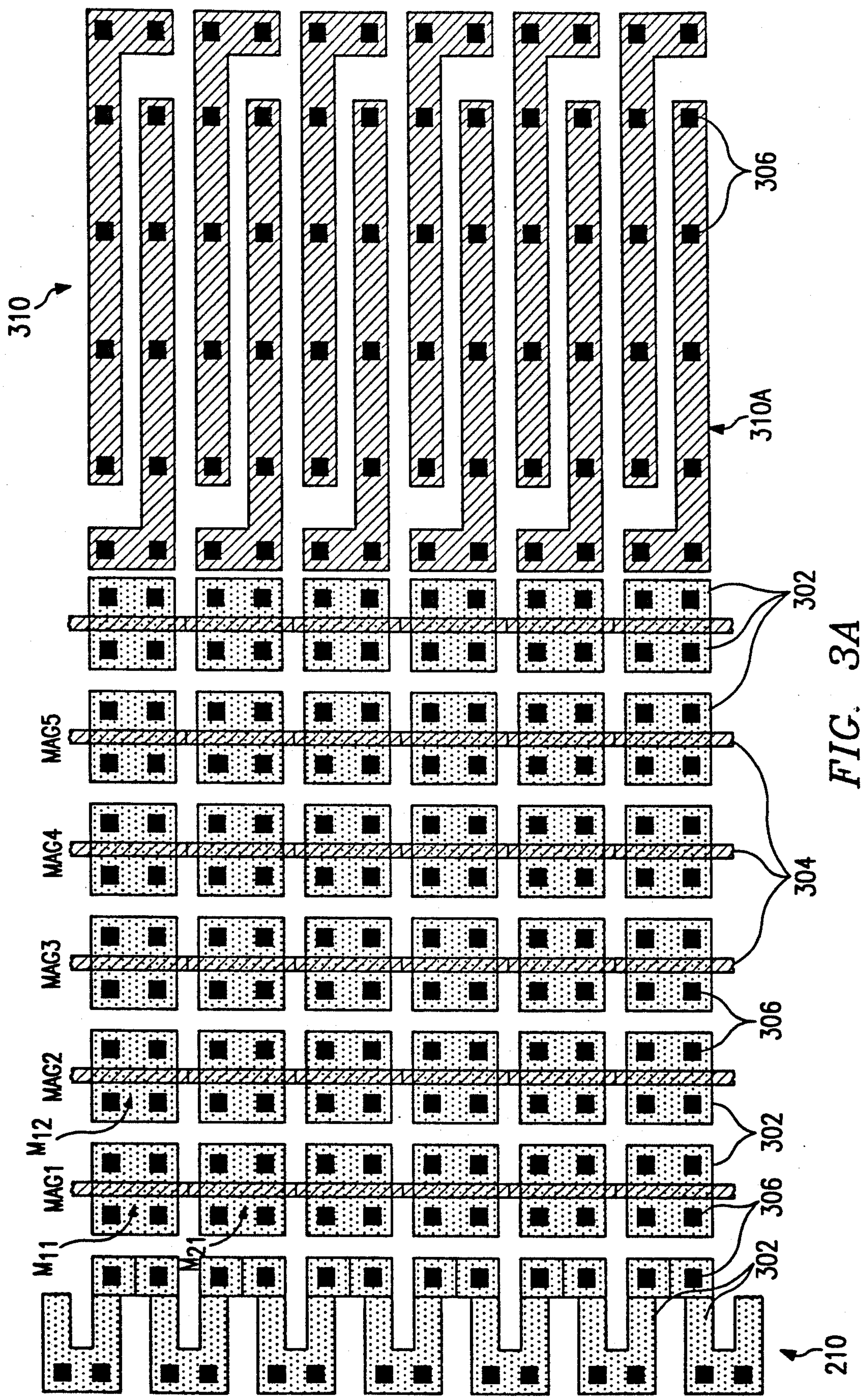
FIGS. 3A and 3B are overlays, which show important portions of the layout actually used for the array 100, in the presently preferred embodiment.
Figure 3B:
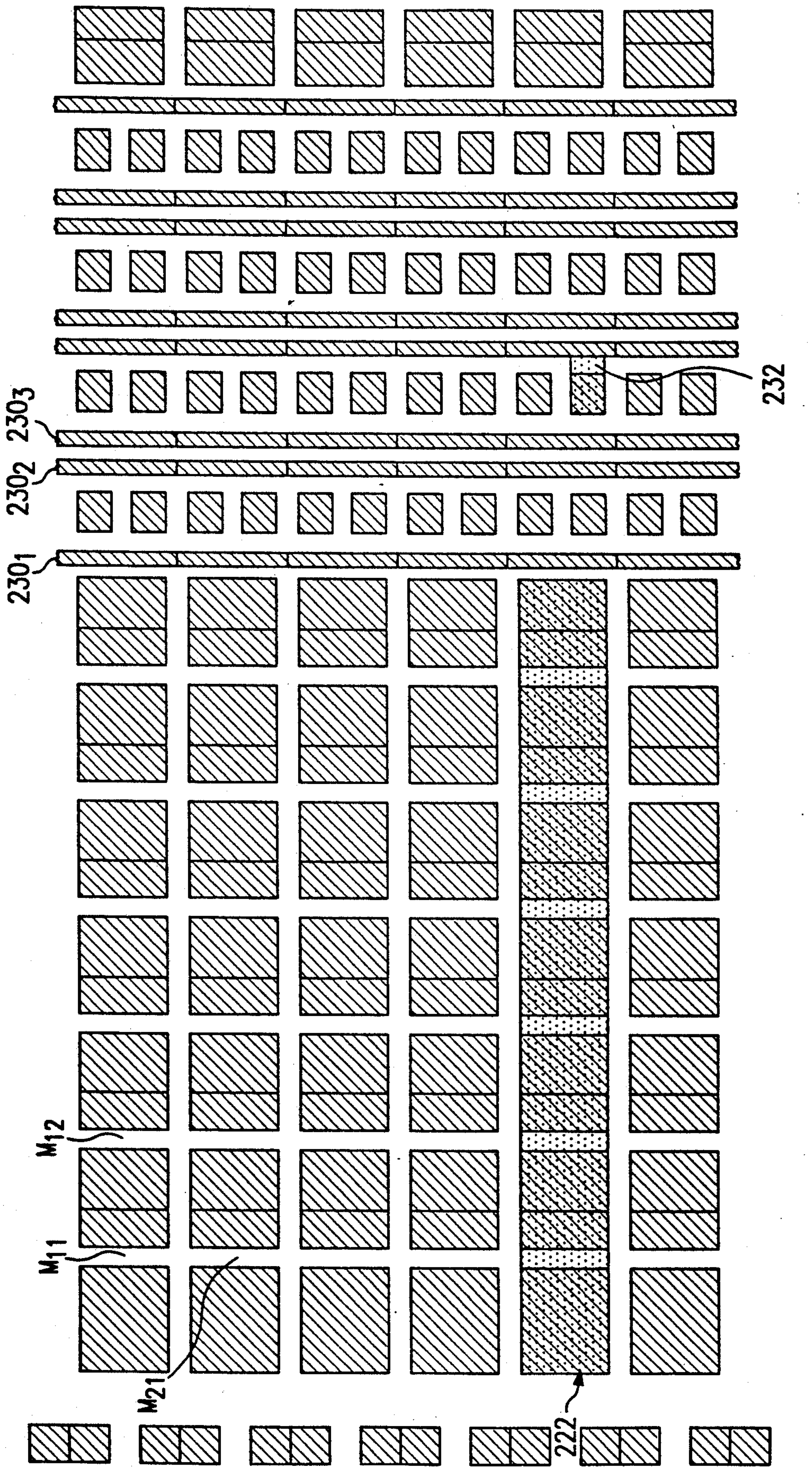

FIGS. 3A and 3B are overlays which show important portions of the layout actually used for the array 100, in the presently preferred embodiment. (The line of thick and thin bars on the right side of each Figure is not actually part of the integrated circuit, but is provided to show the alignment of these two Figures.) FIG. 3A shows the metal layer. FIG. 3B shows the poly (i.e. polysilicon) layer 304, active area 302, and contacts 306. (The "active" area refers to locations where the thick field oxide has been cleared. Thus, a MOS transistor will occur wherever poly crosses active. See Meade & Conway's *Introduction to VLSI Systems*, which is hereby incorporated by reference.)

Each of the many small squares shown in FIG. 3B is a contact. Each contact location will connect the metal layer to polysilicon (if polysilicon is under the contact) or else to substrate.

The portion shown in FIGS. 3A and 3B includes 6 rows and 6 columns of cells, and eight of the column lines 230. However, the array structure shown can very easily be repeated, simply by replicating elements, to vary these numbers as desired. Note that the channel locations of transistors $M_{11}$, $M_{12}$, and $M_{21}$ are shown in both FIGS. 3A and 3B, to help show the overlay of these Figures, even though the actual transistor structure is defined by the structure shown in FIG. 3B and not by that shown in FIG. 3A.

The resistor string 210 is provided by an extended portion of the active area, in the presently preferred embodiment. The active area provides a sheet resistance, in the preferred embodiment, which is large enough that resistor 222 will not overload the drive capability of the op amps which provide the greater reference voltage $GV_{REF}$. (Of course, as will obvious to those skilled in the art of IC design, the resistor string 210 could alternatively be realized using polysilicon resistors.) Note that, in the example shown, only one of the rows has been programmed: in FIG. 3A, metal straps 222 will short out transistors $M_{51}$, $M_{52}$, $M_{53}$, $M_{54}$, and $M_{56}$, so that transistor $M_{55}$ is the only active device left operational in this row. Jumper 232 connects this row to column line $230_4$. Thus, the effect of the metal options shown on the fifth row is that column line $230_4$ will be connected to the divided-down voltage at the start of this row if control signal MAG5 is high. Note that polysilicon links 310 permit easy selection of the connections of the column lines 230: each of the left link portions 310A is connected to the end of a row 220, and each of the right link portions 310B is connected to the end of another row 220 to the right of the array portion shown. (The whole structure shown is preferably replicated in mirror image to the right of the of the structure shown, starting with another resistor string 210.) On each of the links 310, four contacts are brought up to four tabs (in the metal level). Each of these tabs can be connected to either or both of two column lines 230. Thus, these metal tabs allow designers to have easy access (by routing lines in the metal level) to the column lines $230_1$, $230_2$, etc. It may also be advantageous, for reasons of space compaction, to use further right-left replication (in the orientation shown) to provide additional subarrays, which can be connected together electrically to act as if they were a single larger array.

In the metal layer shown in FIG. 3B the straps and jumpers 222 and 232 represent modifications of the initial pattern. That is, when a designer calls up a metal layer pattern for modification, no jumpers 222 would (typically) be present to short out transistors, and no straps 232 would connect a link 310A or 310B to any of the column lines 230. The designer can then modify the initial pattern as desired. (Of course, in practice it is also possible, and likely to become increasingly common, to do such mask modification in software, so that the services of an experienced designer are not needed.)

To use this configuration to construct a functional circuit, a designer would normally use the following sequence of steps. (Of course, other steps can be added to this sequence.)

Suppose, for example, the goal is to provide a programmable waveform synthesis circuit.

1. First, the designer identifies each target waveforms. (Each waveform can be scaled to a maximum value of unity, since scaling can be accomplished by output buffer stages.) Normally, the target waveform envelopes will be defined by other considerations, e.g. by interface standards (in communications or comparable applications), or to provide a maximal basis in a parametric model of perception (in speech synthesis, music synthesis, or comparable applications), or simply by the inputs of a customer or another design group.

2. The designer then picks a piecewise-linear approximation to the target waveform, so that the target waveform is approximated as a sequence of time segments, and, at each segment, the output is a constant voltage, or a constant slew rate, or an asymptotic approach to a constant voltage. (For simplicity, it is most preferable that the approximation use a sequence of constant voltages.) The output values of successive segments may be different (but the resulting waveform will have a maximum slew rate defined by the electrical characteristics of the circuit).

3. The designer then estimates the resultant waveform which occurs when the semi-custom analog circuit according to the present invention is programmed to synthesize a waveform with voltage-of-time dependency in accordance with the approximation of the preceding step.

4. The designer then assesses the goodness-of-fit between the resultant waveform of step 3 and the target waveform of step 1. If the designer so chooses (for example, if the goodness of fit is unacceptable), steps 2-3 are iterated.

5. Optionally, the designer may then further iterate steps 2-4, attempting to reduce the complexity of the approximation of step 2, without unacceptably degrading the goodness of fit.

6. The designer then repeats steps 1-5 for each of the target waveforms. The result of this is a model, for each target waveform, which includes a sequence of delay times; a set of possible output voltages; and a set of control signals.

7. The designer then attempts to condense the parameter sets of step 6. For example, if two different target waveforms use nearly the same voltage for respective parts of their respective delays, the designer may be able to use exactly the same voltage for these two instances, which would reduce the number of taps required in the resistor string (or other voltage source). Optimization of this type requires iteration of steps 1-7.

8. After iteration of such changes, the designer can specify the connection options for the integrated circuit (in conventional fashion), if the numbers of control lines, different time delays, and output voltage levels do not exceed the capability of the resistor string.

The preferred system context of the disclosed innovative device structure, and method for making a device structure, will now be described in detail, to better show the advantages of the claimed inventions.

Figure 6:
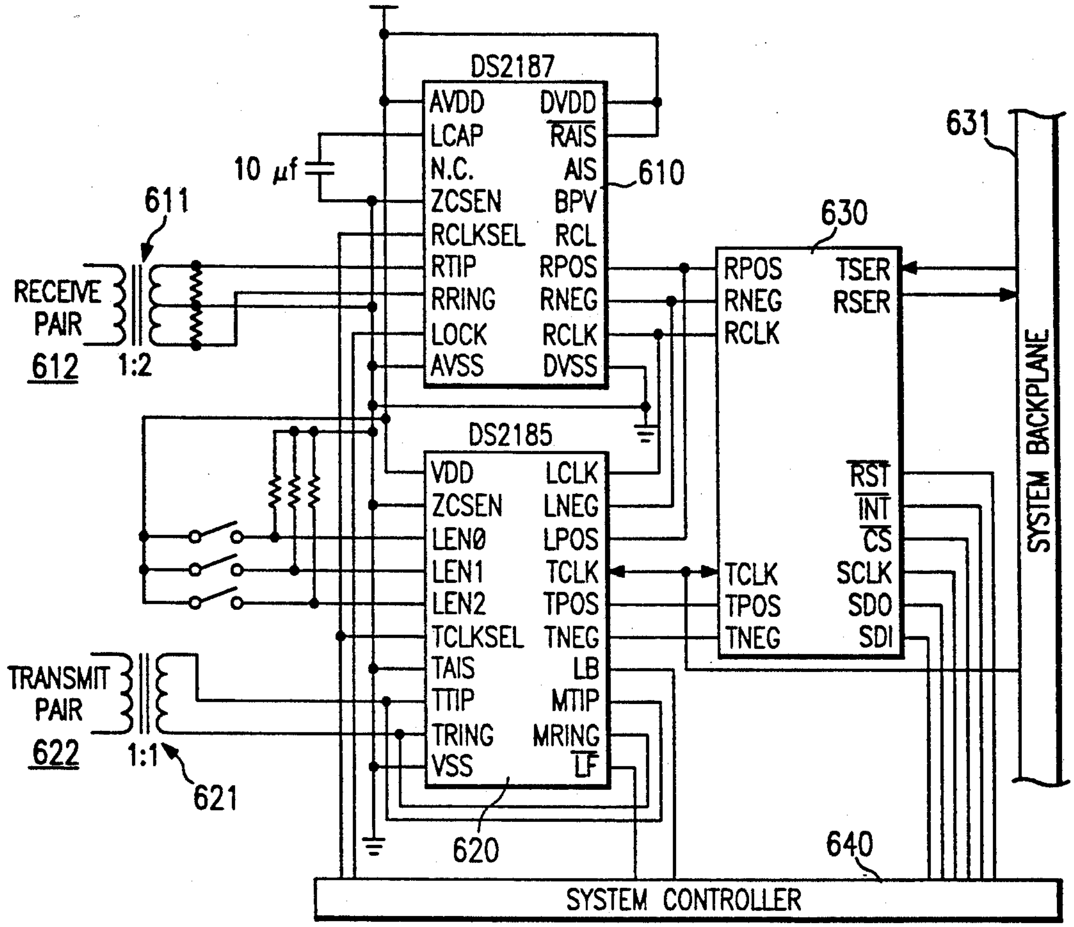
FIG. 6 shows a complete T1 interface, as enabled by the innovative teachings set forth herein.

FIG. 6 shows a complete T1 interface, as enabled by the innovative teachings set forth herein. Pins TTIP and TRING of a transmit line interface unit 620 is connected through transformer 621 to a twisted pair 622, which sends data out to the telephone company interface. (The transformer provides impedance matching and DC isolation.) Similarly, pins RTIP and RRING of a receiver line interface chip 610 are connected, through a transformer 611, to another twisted pair 612, which receives data from the telephone company. A data transceiver unit 630 performs the appropriate data formatting transformations, to link the serial data interfaces of units 610 and 620 to a system backplane connection 631. (For example, the system backplane may be a VME bus, or conform to another of the many bus architectures available.)

A system controller unit 640 controls the data transceiver unit 630 and the line interface chips 610 and 620. A five-wire serial data bus 642 (including data in, data out, interrupt, clock, and address lines) links the controller chip 640 with the data transceiver unit 630. In the presently preferred embodiment, the system controller unit 640 is a DS5000 nonvolatile microcontroller, but of course, a wide variety of other programmable logic could be used instead.

The twisted-pair line driven by the transmit interface chip 620 may go through a digital cross connect (commonly referred to as a "DSX") to the channel service unit (often referred to in T1 literature as a CSU). The telephone companies' lines begin at the channel service unit.

Figure 7:
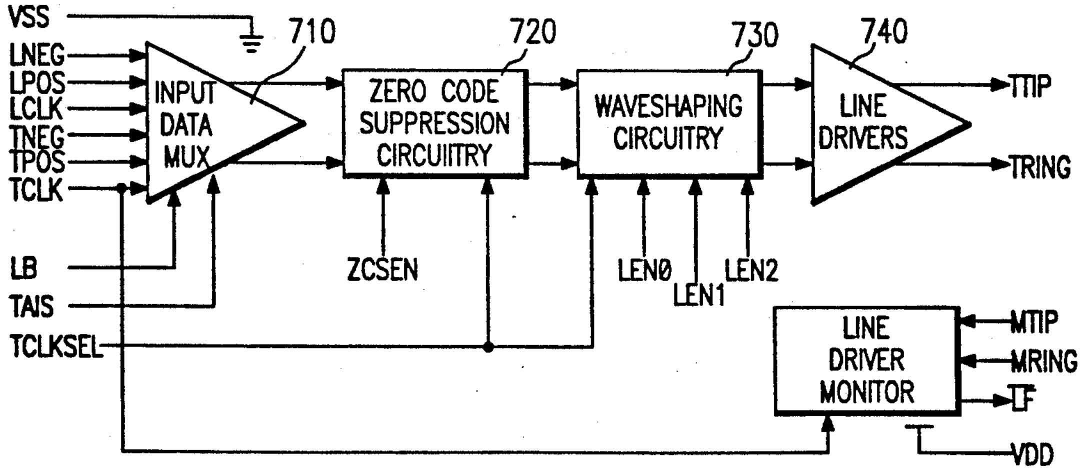
FIG. 7 shows the overall architecture of the integrated circuit which, in the preferred embodiment, implements this interface unit 620.

The transmit interface unit 620 performs waveform synthesis, as will now be described, to meet the T1 specification. FIG. 7 shows the overall architecture of the integrated circuit which, in the preferred embodiment, implements this interface unit 620. An input data multiplexer 710 selects between loopback signals LNEG, LPOS, and LCLK, and transmit signals TPOS, TNEG, and TCLK, in accordance with control signals LB and TAIS, to provide data and clock outputs. (These signals are described in greater detail below.) These data and clock outputs are fed, through zero code suppression circuitry 720, to waveshaping circuitry 730. The waveshaping circuitry 730 accordingly generates shaped analog waveforms, as will be described below. The output of the waveshaping circuitry 730 is fed to line driver circuits 740, which provide the inputs TTIP and TRING (which will be connected to transformer 621).

Figure 8:
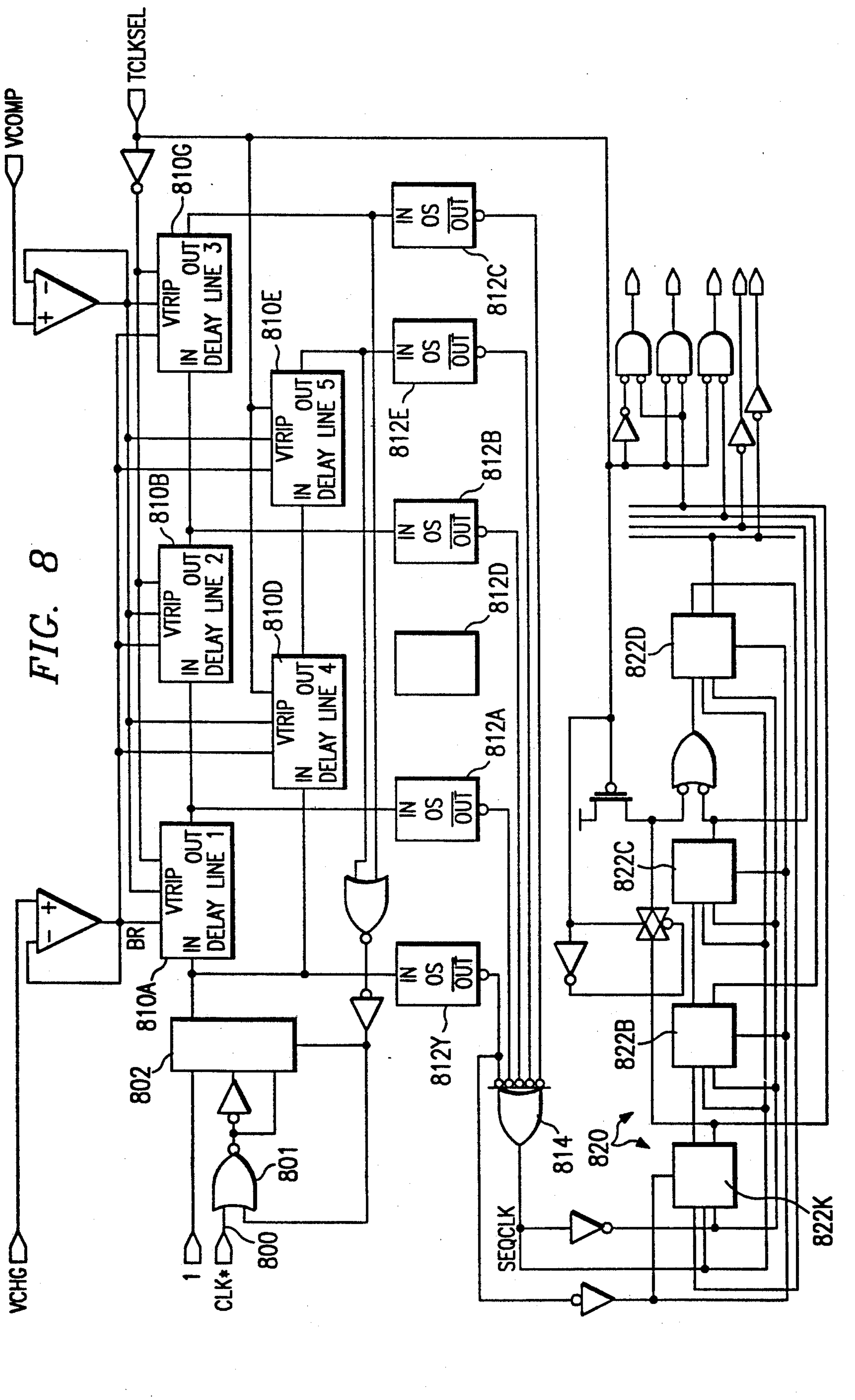
FIG. 8 shows the circuitry actually used, in the presently preferred embodiment, to provide the timing (control) inputs to the output selection circuitry.

FIG. 8 shows the circuitry actually used, in the presently preferred system embodiment, to provide the timing (control) inputs to the voltage/time array 100. An input clock signal, on line 800, is coupled through a D flip-flop 802. (Gate 801 prevents the input clock from being propagated, if a previous clock is still being propagated through delay lines 810.)

Delay elements 810A, 810B, and 810C are connected in series. Delay elements 810D and 810E are also connected in series. The signal TCLKSEL is used to deactivate elements 810D-810E for T1 use, or to deactivate 810A-810C for CEPT use. A biasregulating signal BR, and a trip-point-select signal VTRIP, are connected in common to all of the delay elements 810.

The output of each delay element 810 is connected to a respective one-shot circuit 812. (In addition, one-shot 812Y also receives the initial clock pulse.) Gate 814 combines the outputs of the one-shots, to produce a sequenced clock signal SEQCLK. This sequenced clock signal clocks a counter chain 820, which includes several flip-flops connected in series. (This counter chain, in the presently preferred embodiment, is somewhat similar to a Johnson counter, but also has similarities to a ring counter.) The first clock pulse sets the first flip-flop 822A, and drives its output high. Thereafter, each clock pulse shifts the high-output state to the next flip-flop in the chain, to drive timing signals TT1, TT2, TT3, in succession, until the last stage drives timing signal TEND.

Figure 5A:
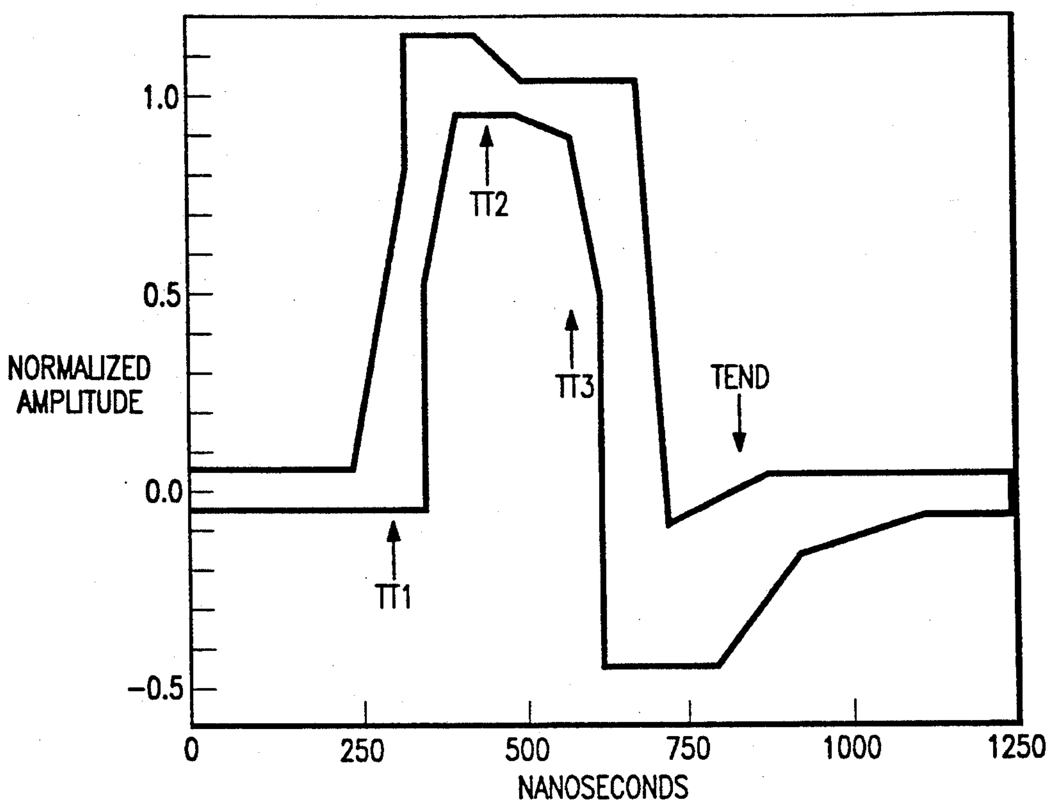
FIG. 5A shows the permissible envelopes of pulse waveforms at a T1 transmitter. (The overlaid curves show how this envelope must be modified under different load conditions.)
Figure 5B:
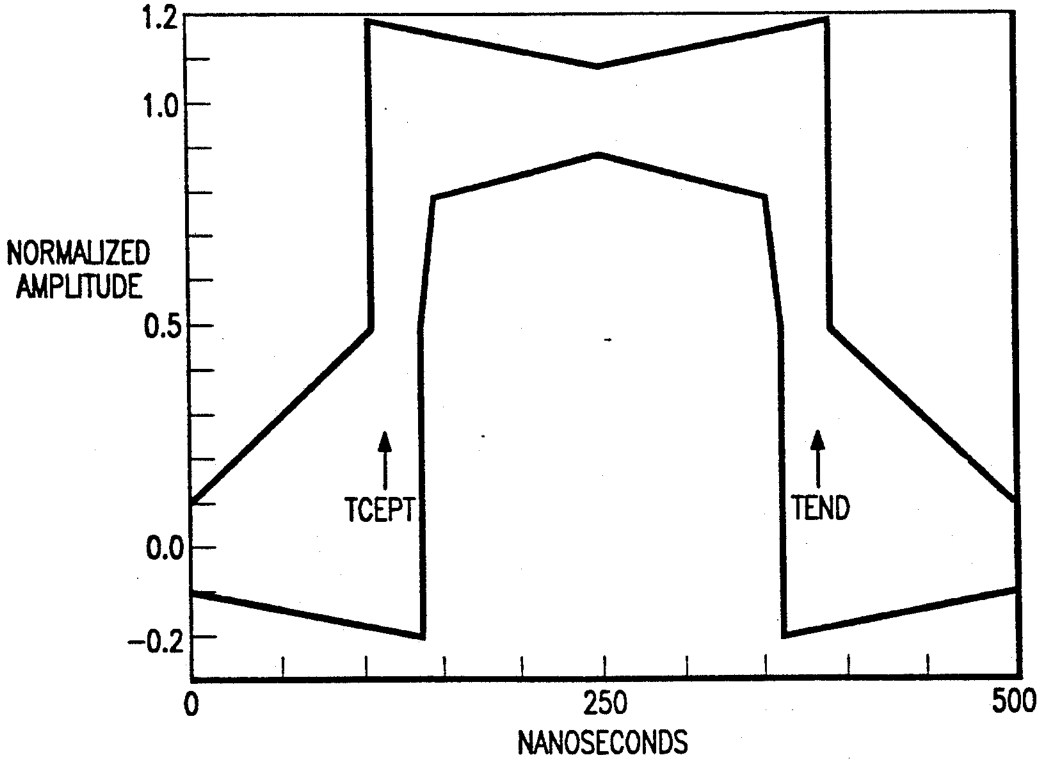
FIG. 5B shows the permissible envelope of pulse waveforms for CEPT transmission.

Significant control signals are marked onto FIGS. 5A and 5B, to show their timing relations. FIG. 5A shows (overlaid with the T1 waveform envelope) the timing of the control signals TT1, TT2, TT3, and TEND, which are used, in the preferred embodiment, to generate a T1 waveform using the circuitry of FIG. 8. FIG. 5B shows (overlaid with the CEPT waveform envelope) the delays used for the control signals TCEPT and TEND, which are used, in the preferred embodiment, to generate a CEPT waveform using the circuitry of FIG. 8.

Figure 9:
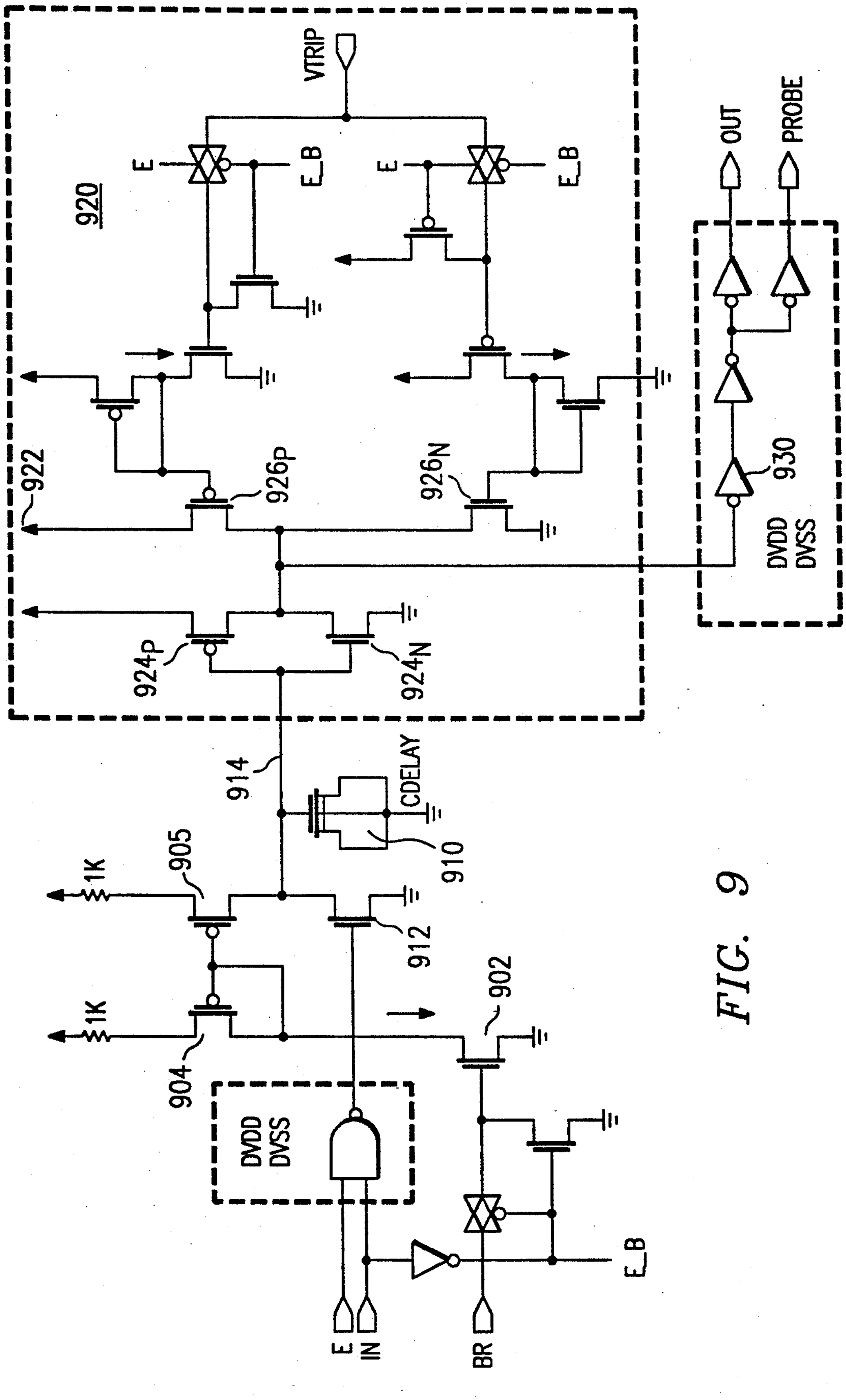
FIG. 9 shows the circuitry of the delay lines 810, in the presently preferred embodiment.

FIG. 9 shows the circuitry of the delay lines 810, in the presently preferred embodiment.

The BR input is a temperature-compensated voltage which sets the drive current level. (The BR control voltage is actually mirrored from a transistor which has the same gate length as current sink transistor 902, which is controlled by the BR voltage. In the presently preferred embodiment, the nominal gate length of this device is about 20 microns, but of course this could be widely varied.) The current passed by transistor 902 is mirrored again, through transistors 904 and 905, to provide the charging current for the delay stage.

This charging current is integrated in capacitor 910. When input signal IN goes high (while enable signal E is high), transistor 912 will be turned off. The current passed by transistor 905 will then flow into capacitor 910, and the voltage on node 914 will begin to rise.

Comparator 920 compares the voltage on node 914 with the $V_{TRIP}$ input. As the capacitor 910 charges, device $924_N$ will pass an increasingly more current, and device $924_P$ will pass increasingly less. Whenever the current passed by pull-down devices $924_N$ and $926_N$ exceeds that passed by pull-up devices $924_P$ and $926_P$, the voltage of node 922 will begin to drop. This node is connected to a digital output buffer 930.

The enable signal E, which disables the delay lines, is taken from the TCLKSEL signal or its complement. In FIG. 8, note that this signal is provided as a complemented input to delay lines 810D and 810E, but is not complemented at the input to lines 810A, 810B, and 810C. Thus, by switching this signal, the waveshaping output can be switched between the waveform needed for the T1 standard and the waveform needed for the CEPT standard.

The organization and operation of the transmit line interface chip, in the presently preferred embodiment, will now be described in greater detail.

The transmit line interface chip 620 interfaces user equipment to North American (T1-1.544 MHz) and European (CEPT-2.048 MHz) primary rate communications networks. The device is compatible with all types of twisted pair and coax cable found in such networks.

On-chip components include: programmable waveshaping circuitry, line drivers, remote loopback and zero suppression logic. A line-coupling transformer is the only external component required.

Short loop (DSX-1,0 to 655 feet) and long loop (CSU; 0 db, −7.5 db and −15 db) pulse templates found in T1 applications are supported. Appropriate CCITT Red Book recommendations are met in the CEPT mode.

Application areas include digital-to-analog converters, CSU, CPE, channel banks and PABX to computer interfaces such as DMI and CPI. This embodiment also supports ISDN-PRI (primary rate interface) specifications.

PIN DESCRIPTION

| PIN | | TYPE | DESCRIPTION |
|---|---|---|---|
| 1 | TAIS | I | Transmit Alarm Indication Signal. When high, output data is forced to all "ones at the TCLK (LB=0) or LCLK (lb=1) rate. |
| 2 | ZCSEN | I | Zero Code Suppression Enable. When high, B8ZS or HDB3 encoder enabled. |
| 3 | TCLKSEL | I | Transmit Clock Select. Tie to VSS for 1.544 MHz (T1) applications, to VDD for 2.048 MHz (CEPT) applications. |
| 4 | LEN0 | I | Length Select 0,1, and 2 |
| 5 | LEN1 | | State determines output T1 waveform shape and characteristics. |
| 6 | LEN2 | | |
| 7 | VDD | — | Positive Supply. (5.0 volts.) |
| 8 | TTIP | O | Transmit Tip and Ring. |
| 9 | TRING | | Line driver outputs, connect to transmit line transformer. |
| 10 | VSS | — | Signal Ground. (0.0 Volts.) |
| 11 | LF* | O | Line Fault. Open collector active low output. Held low during an output driver fault and/or failure; tristated otherwise. |
| 12 | MRING | I | Monitor Tip and Ring. Normally connected to TTIP and TRING. |
| 13 | MTIP | I | Sense inputs for line fault detection circuitry. |
| 14 | LB | I | Loopback. When high, input data is sampled at LPOS and LNEG on falling edges of LCLK; when low, input data is sampled at TPOS and TNEG on falling TCLK. |
| 15 | TNEG | I | Transmit Data |
| 16 | TPOS | | Sampled on falling edges of TCLK when LB=0. |
| 17 | TCLK | I | Transmit Clock. 1.544 MHz or 2.048 MHz primary data clock. |
| 18 | LNEG | I | Loopback Data |
| 19 | LPOS | | Sampled on falling edges of LCLK when LB=1. |
| 20 | LCLK | I | Loopback Clock - 1.544 MHz or 2.048 MHz loopback data clock. |

Input Data Modes: Input data is sampled on the falling edges of TCLK and LCLK and may be bipolar (dual rail) or unipolar (single rail, NRZ). TPOS, TNEG and TCLK are the data and clock inputs when LB=0; LPOS, LNEG and LCLK when LB=1. TPOS and TNEG (LPOS and LNEG) must be tied together in NRZ applications.

Zero Code Suppression Modes: Transmitted data is treated transparently (no zero code suppression) when ZCSEN=0. HDB3code words replace any all-zero nibble when ZCSEN=1 and TCLKSEL=1. B8ZS code words replace any incoming all-zero byte when ZCSEN=1 and TCLKSEL=0.

Alarm Indication Signal: When TAIS is set the all "ones" code is continuously transmitted at the TCLK rate (LB=0) or the LCLK rate (LB=1).

Waveshaping: The device supports T1 short loop (DSX-1; 0 to 655 feet), T1 long loop (CSU; 0 db, -7.5 db and -15 db) and CEPT (CCITT Red Book G.703) pulse template requirements. On-chip laser trimmed delay lines clocked by either TCLK or LCLK control a precision digital-to analog converter to build the desired waveforms which are buffered differentially by the line drivers.

The shape of the "pre-emphasized" T1 waveform is controlled by inputs LEN0, LEN1, and LEN2

(TCLKSEL=0). These control inputs allow the user to select the appropriate output pulse shape to meet DSX-1 or CSU templates over a wide variety of cable types and lengths. Those cable types include: ABAM, PIC, and PULP.

The CEPT mode is enabled when TCLKSEL=1. Only one output pulse shape is available in the CEPT mode; inputs LEN0, LEN1 and LEN2 may be any state except all zeros.

The line coupling transformer also contributes to the pulse shape seen at the cross-connect point; using the transformers specified in Table 4 ensures that the measured waveform meets DSX-1 and/or CSU template requirements. Transformers are 1:1.

The waveshaping circuitry does not contribute significantly to output jitter. Output jitter will be dominated by the jitter on TCLK or LCLK. TCLK and LCLK need only be accurate in frequency, not duty cycles.

LINE DRIVERS: The on-chip differential line drivers interface directly to the output transformer. To optimize device performance, length of the TTIP and TRING traces should be minimized and isolated form neighboring interconnect. The device will enter a standby mode when the input data is all "zeros". This disables the output drivers and reduces power consumption significantly.

FAULT PROTECTION: The line drivers are fault protected and will withstand a shorted transformer secondary (or primary) without damage. Inputs MTIP and MRING are normally tied to TTIP and TRING to provide fault monitoring capability. Output LF* will transition low if 192 TCLK cycles occur without a "one" occurring at MTIP or MRING. LF* will tristate on the next "one" occurrence or two TCLK periods later, whichever is greater.

The "one" threshold of MTIP and MRING varies with the line type selected at LENO, LEN1 and LEN2. This insures detection of the lowest level 0 to 1 transition (−15 dB buildout) as it occurs on TTIP and TRING. MTIP and MRING may be tied to neighboring device's TTIP and TRING outputs to provide superior fault monitoring.

T1 LINE LENGTH SELECTION

| LEN2 | LEN1 | LEN0 | OPTION SELECTED | APPLICATION |
|---|---|---|---|---|
| 0 | 0 | 0 | Test Mode | Do not use |
| 0 | 0 | 1 | −7.5 dB buildout | T1 CSU |
| 0 | 1 | 0 | −15 dB buildout | T1 CSU |
| 0 | 1 | 1 | 0 dB buildout (0–133 feet) | T1 CSU, DSX-1 Crossconnect |
| 1 | 0 | 0 | 133–266 feet | DSX-1 Crossconnect |
| 1 | 0 | 1 | 266–399 feet | DSX-1 Crossconnect |
| 1 | 1 | 0 | 399–533 feet | DSX-1 Crossconnect |
| 1 | 1 | 1 | 533–655 feet | DSX-1 Crossconnect |

NOTE:
The LEN0, LEN1 and LEN2 inputs control T1 output waveshapes when TCLKSEL = 0. The G.703 (CEPT) template is selected when TCLKSEL = 1 and LEN0, LEN1 and LEN2 are at any state except all zeroes.

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

Note that the converter architecture provided by the present invention can provide normal digital-to-analog converter functionality. For example, by using a ladder of $2^n$ equal resistors, an n-bit digital-to-analog converter can be directly configured. By using resistors scaled in powers of two, and adding a shunting transistor in parallel with each resistor, a wider-range digital-to-analog converter can be configured.

Although a digital-to-analog converter which uses programmable delay lines to provide the control signals (as in the preferred embodiment) is highly advantageous for shaping waveforms, the ability to provide a more conventional digital-to-analog converter gives the circuit designer more options.

In addition to the selection of one of the scaled reference voltages from the resistor string 210, alternative versions of the present invention also permit the tap voltages of the resistor string 210 to be varied. This can be done in several ways. In one class of alternative embodiments, this is done by configuring the jumpers 232 so that, in some states of the control logic, two of the row lines would both be connected to a common isolated column buss. For example, suppose that the example of FIG. 2 is modified as follows:

- the second transistors $M_{2,2}$ and $M_{3,2}$ in the second and third row lines are not shunted by straps 222, and all other transistors on these two row lines are shunted;
- the second and third row lines $\mathbf{220_2}$ and $\mathbf{220_3}$ are both connected, through respective jumpers 230, to a dummy column buss $\mathbf{230}_{dummy}$.

If these changes are made, the voltage seen at TL2U when signal LEN2 is high will no longer be $$V_{REF} + (GV_{REF} - V_{REF})\left(\frac{R_{SUM} - R_{210/1}}{R_{SUM}}\right),$$

but instead will be $$V_{REF} + (GV_{REF} - V_{REF})\left(\frac{R_{SUM} - R_{210/1} - R_{210/3}}{R_{SUM} - R_{210/3}}\right),$$

which is closer to $V_{REF}$.

In such embodiments, the output-switching logic can also be used to disable outputs which (under some control states) may be in use as intermediate nodes, to change the total value $R_{SUM}$ of the resistor string.

Such changes in scaling can also be accomplished by switching trim resistors in or out of resistors $R_1$-$R_4$. However, this would not be as suitable for rapid switching, due to the need for the amplifiers to settle. A further option is switching additional series resistors in or out of the resistor chain 210, but this is even less desirable, due to the resulting layout complexities.

A further advantage of the disclosed architecture is that changes in the sequencing of output levels can easily be accomplished by programmation changes in the array 100. Thus, for example, even if the timing control signals TT1 etc. are generated elsewhere, sequencing changes can readily be made in the time/voltage array 100, by changing the connections of the magnitude control inputs LEN1 etc. This capability gives the designer additional flexibility.

Note that the innovative architecture is highly modular and expandable: As many sequencing transistors as desired can be added into a row; large numbers of scaled voltages can be used if desired; the number of column busses can be increased if desired; and the number of result lines can also readily be increased.

In a further alternative, some ANDing logic could be added, to steal phases from overlaps. For example, suppose that row line ROW1 is gated only by control signal LEN4, and another row line ROW2 is gated only by control signal LEN5. If control signals LEN4 and LEN5 are sequential phase signals which overlap for part (but not all) of their durations, then an intermediate phase can be created by defining another row line (for example, ROW3) to be gated by both LEN4 and LEN5. In this case, it may be desirable to define some of the control lines as complementary. In the example just described, any problem of collision can be avoided if row line ROW1 is gated both by control signal LEN4 and also by another signal LEN5* which is the complement of LEN5, and if row line ROW2 is similarly gated by LEN5 and LEN4*.

The presently preferred embodiment provides a digital-to-analog converter which is fully double—ended—i.e. which provides complementary waveforms on a pair of output lines—but the innovative teachings can readily be adapted to a single—ended design instead. The use of the double-ended digital-to-analog converter architecture is particularly advantageous for a T1 transmitter, since it means that exactly symmetrical waveforms can be produced, regardless of whether the Mark signal is inverted or not.

This very flexible architecture can be further modified, if desired, to make it more like a programmable logic array, by adding additional gates and interconnects to the topology of the row lines, and thereby introducing additional features of combinatorial or sequential digital or analog functions.

In addition, the innovative ideas set forth above could also be adapted to use other programmation methods. For example, instead of shunting transistors with metal straps, the transistors can be designed as EPROM-like or EEPROM-like devices, where the transistor's threshold voltage is shifted by storing charge on a floating gate. For another example, the programming can also (less preferably) be performed using distributed fuses or antifuses, or using battery-backed static gates. (However, these alternative approaches tend to place more burden on the interconnect density, and are therefore less preferable.)

Again, it must be understood that the innovative teachings herein are very broadly applicable. It is believed that these teachings may provide a generally useful integrated circuit element, which can be as versatile in analog design problems as logic arrays have proven to be for digital designers.

Moreover, while the preferred system embodiment described is directed to T1 interface requirements, it must be recognized that the waveshaping capabilities provided are very widely applicable. Many applications can make use of the capability to provide a semi-custom waveform, with very high time-domain resolution, economically.

It should also be recognized that it is not strictly necessary for all of the delay line stages to be connected in series. While this is convenient (to minimize capacitor size), this arrangement does have the minor disadvantage that a change in an early delay stage will also change the total delay of all later stages. Thus, in some applications it may be preferable to use multiple delay stages in series and in parallel.

It should also be noted the a variety of ways can be used to configure the outputs of the delay stages into control inputs for the voltage generator stages. For example, it may be preferable to provide more delay line taps than would be needed for any one waveform type, with transistors to disable some of the control lines depending on the waveform type needed.

In the presently preferred system embodiment, the control inputs LEN1 etc. are used to select the voltage magnitudes coming out of the voltage/time array 100, and the timing control signal TT1 etc. are used to select the sequence of these magnitudes to form the desired waveform. However, alternatively, at least some of the sequence control can be performed by using the array inputs LEN1 etc. (In fact, the functions of these two groups of control inputs could even be reversed if desired, with the LEN1 etc. inputs each used to control the sequence of levels appearing on each column bus, and the TT1 etc. controls used to select which of the column busses would be connected to the output lines.)

In a further optional alternative, switching logic is also used to switch outputloading capacitors in or out, to provide variable slew rate control on the outputs. This capability permits a user to more easily match a complex target waveform specification where it may be necessary to provide controlled rates of voltage change. (By comparison, the presently preferred embodiment simply uses capacitors on the output line to limit the maximum slew rate. Instead, this alternative embodiment would permit the maximum slew rate to be varied dynamically.)

As a further class of alternatives, it is also possible to perform additional programming dynamically. For example, instead of trimming capacitors to adjust the delay line stages, this can be done by switching capacitors (or resistors), or even by using the non-linear capacitance of certain semiconductor structures to provide varactor trimming.

It is also possible to use different techniques to provide the multiple input reference voltages. Instead of the resistor string or capacitor array mentioned above, more complex circuits can be used, including (optionally) active devices to permit changing these input voltage levels on the fly.

It will be readily recognized by those skilled in the art that the innovative concepts could readily be adapted to a different allocation of functions onto integrated circuits. In the presently preferred embodiment each of the units 110, 120, 130, and 140 is built on a separate integrated circuit, but alternatively some of these units could be combined.

In a further alternative embodiment, the delay line blocks can be modified so that their delay is not constant. In some applications, it may be preferable to use variable-delay blocks. Instead of providing a delay of a fixed number of nanoseconds, such a circuit can be configured to (for example) provide delay for a predetermined percentage of the clock period (as long as the clock frequency is within a permissible range).

It should also be noted that the use of a highly programmable digital-to-analog converter, as in the presently preferred embodiment, is not by any means the only way in which the innovative ideas set forth could be used. Instead of a digital-to-analog converter, other analog voltage generation circuits could be used. A tremendous variety of such circuits are known, and such circuits can be selected for the utility in forming a piece-wise time-domain approximation of a desired waveform.

As will be recognized by those skilled in the art, the innovative concepts described in the present application can be modified and varied over a tremendous range of applications, and accordingly their scope is not limited except by the allowed claims.

What is claimed is:

1. An integrated circuit digital to analog converter, comprising:

- a voltage source, which provides multiple scaled voltages;
- a plurality of row lines, connected to receive respective ones of said scaled voltages from said voltage source;
- each of said row lines including multiple selection transistor locations in series,
  - respective ones of said selection transistors having gates which are connected to control inputs,

- programmable connections being located to short out selected respective ones of said selection transistors;
- a plurality of column busses;
- a plurality of programmable jumpers, each selectably connecting a respective one of said row lines to a respective one of said column busses;
- said selection transistors being configured so that, multiple ones of said column busses may be driven simultaneously.

2. The integrated circuit of claim 1, comprising at least 64 of said row lines.

3. The integrated circuit of claim 1, wherein said scaled voltages provided by said voltage source include both voltages which are positive with respect to a reference voltage connection, and also voltages which are negative with respect to a reference voltage connection; and wherein said selection transistors are configured to provide complementary with respect to said reference voltage outputs simultaneously on said column busses; and further comprising polarity reversal logic, connected to receive said outputs of said selection transistors and to selectably exchange said outputs in accordance with the state of a control signal.

* * * * *